(12) United States Patent
Burton et al.

(10) Patent No.: US 7,138,716 B2
(45) Date of Patent: Nov. 21, 2006

(54) ADDITION OF METAL LAYERS WITH SIGNAL REALLOCATION TO A MICROPROCESSOR FOR INCREASED FREQUENCY AND LOWER POWER

(75) Inventors: Edward A. Burton, Hillsboro, OR (US); Kumar Anshumali, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 95 days.

(21) Appl. No.: 10/607,550

(22) Filed: Jun. 27, 2003

(65) Prior Publication Data

US 2004/0262765 A1 Dec. 30, 2004

(51) Int. Cl.
*H01L 23/48* (2006.01)
*H01L 29/739* (2006.01)

(52) U.S. Cl. .................. 257/758; 257/202; 257/207; 257/208; 257/E21.59

(58) Field of Classification Search ............... 257/211, 257/635, 758, 202, 207, 208; 438/128, 129; 174/255, 261, 262; 361/794, 795, 805
See application file for complete search history.

(56) References Cited

U.S. PATENT DOCUMENTS

| | | | | |
|---|---|---|---|---|
| 4,467,400 A | * | 8/1984 | Stopper | 361/767 |
| 5,466,892 A | * | 11/1995 | Howard et al. | 174/261 |
| 6,275,407 B1 | * | 8/2001 | Otsuka | 365/63 |
| 6,329,604 B1 | * | 12/2001 | Koya | 174/255 |
| 6,388,200 B1 | * | 5/2002 | Schaper | 174/255 |
| 6,476,330 B1 | * | 11/2002 | Otsuka et al. | 174/261 |
| 6,606,237 B1 | * | 8/2003 | Naito et al. | 361/306.3 |
| 6,664,634 B1 | * | 12/2003 | Thompson et al. | 257/758 |
| 6,823,499 B1 | * | 11/2004 | Vasishta et al. | 716/7 |
| 6,885,043 B1 | * | 4/2005 | Smith et al. | 257/202 |

* cited by examiner

*Primary Examiner*—Douglas W. Owens
*Assistant Examiner*—Dao H. Nguyen
(74) *Attorney, Agent, or Firm*—Fleshner & Kim LLP (57) ABSTRACT

A semiconductor device and method of adding metal layers in a semiconductor device with signal reallocation are disclosed. The device has a first layer with a plurality of signal wires. A second layer adjacent to the first layer is also included that has a plurality of signal wires. The signal wires in the first and second layers are substantially parallel with each other. The signal wires are distributed between the first and second layer in a manner that reduces the wire capacitance and/or resistance thereby permitting higher frequency operation and lower power consumption in the device.

17 Claims, 12 Drawing Sheets

ADDITION OF METAL LAYERS WITH SIGNAL REALLOCATION TO A MICROPROCESSOR FOR INCREASED FREQUENCY AND LOWER POWER

BACKGROUND OF THE INVENTION

1. Field of the Invention

The present invention relates to semiconductor design. In particular, the present invention relates to adding metal layers to a microprocessor to increase operating frequency and lower power consumption.

2. Background of the Related Art

Figure 1:
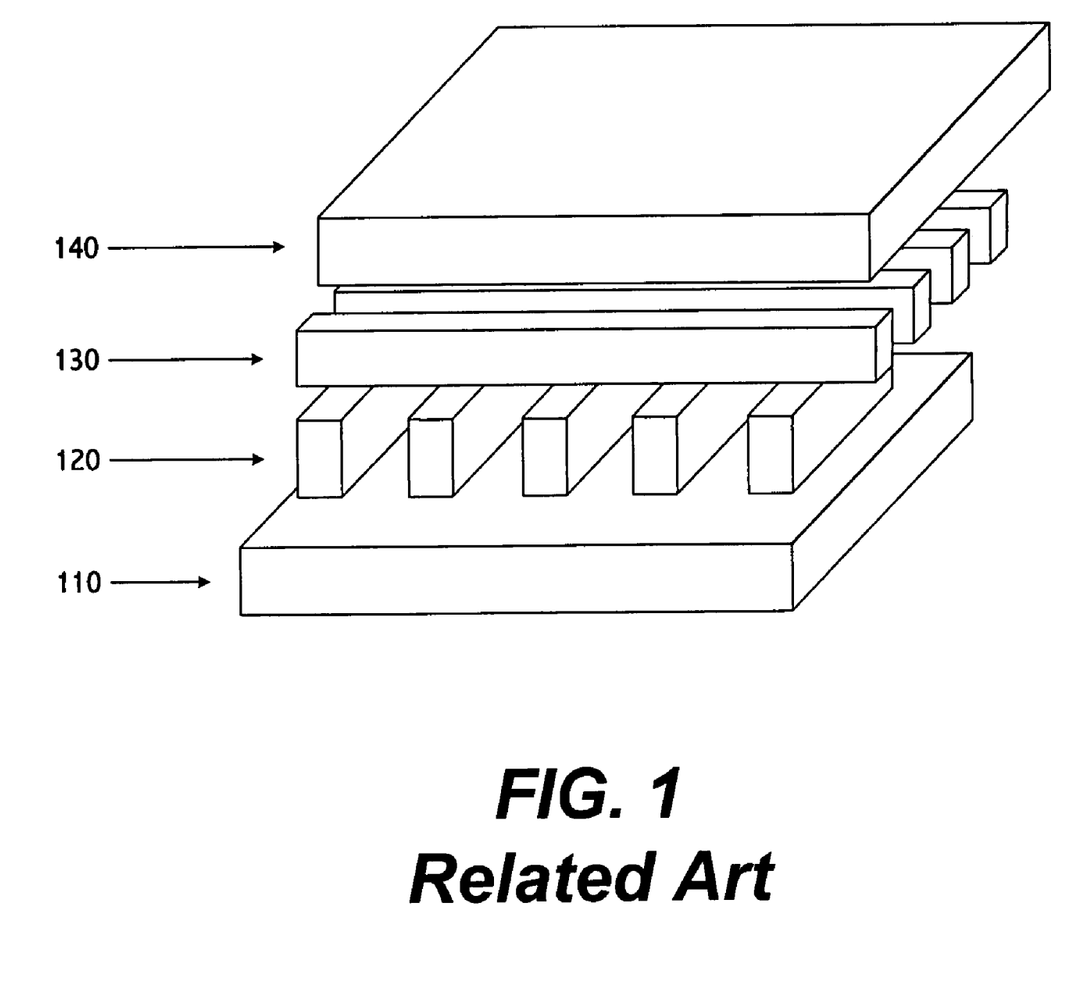
FIG. 1 illustrates a perspective view of a related art interconnect stack containing a plurality of signal wires and layers.

Related art microprocessor designs have an interconnect stack in which signal wires in alternate metal layers are orthogonal to each other. A perspective block diagram is shown in FIG. 1, which illustrates the related art design. In interconnect stack is illustrated with layers 110, 120, 130 and 140. Metal layers 120 and 130 are illustrated with signal wires arranged in an orthogonal pattern as known in the related art, while metal layers 110 and 140 have been approximated by a plane.

Figure 2:
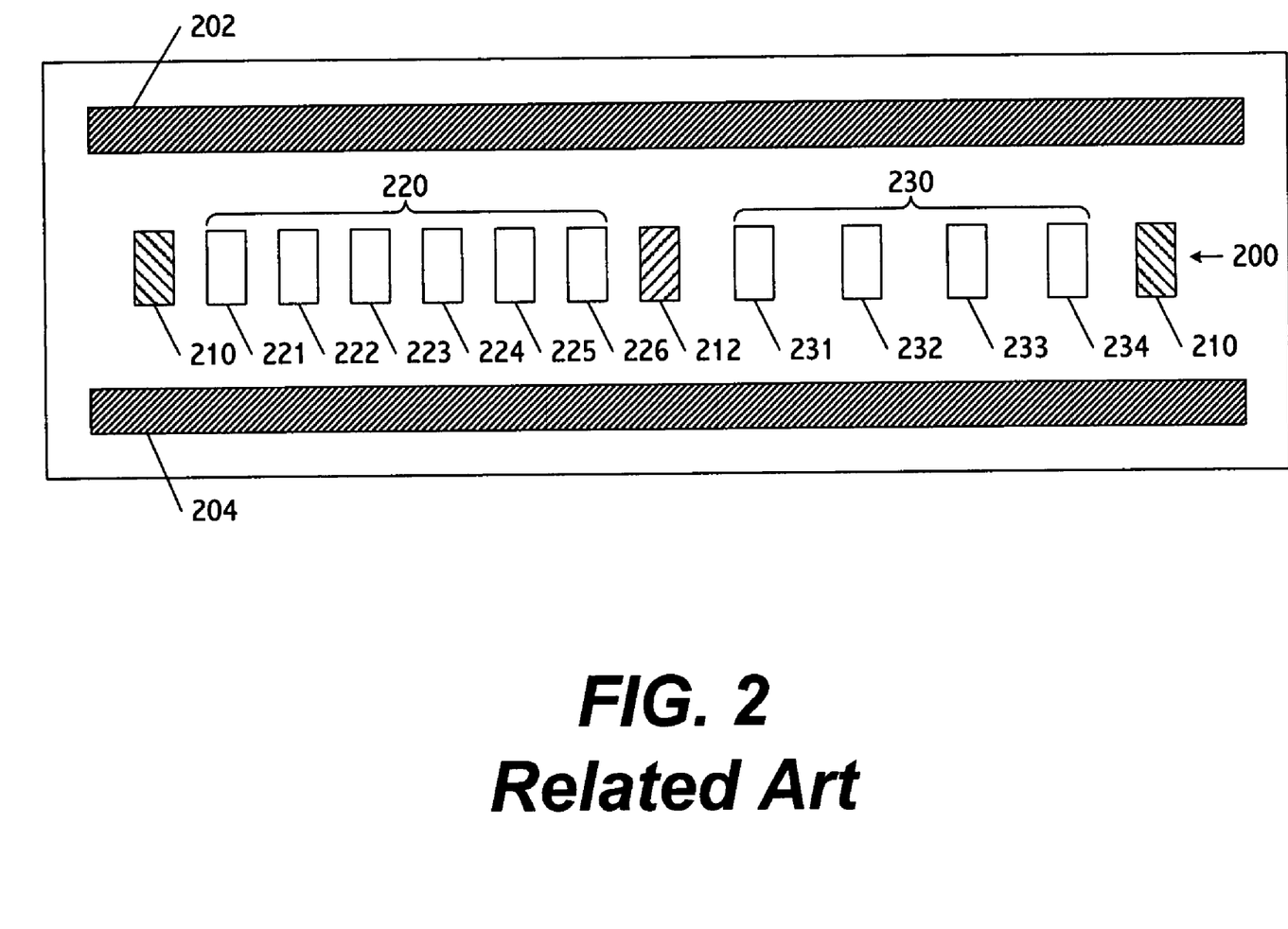
FIG. 2 illustrates an axial view of a related art metal layer containing a plurality of signal wires.

FIG. 2 illustrates an axial view of a related art metal layer interconnect stack. Ground planes 202 and 204, in this example, are above and below layer 200, respectively. Layer 200 includes a plurality of signal wires including power supplies 210 at right and left ends, ground/return 212 and signal wire sets 220 and 230. Each signal wire set includes a plurality of signal wires 221–226 and 231–234, respectively. The first set 220 of six signal wires 221–226 is at a minimum pitch. The second set 230 of four signal wires 231–234 is at a 20% larger pitch. Those skilled in the art will appreciate that the illustrated arrangement is solely for purposes of illustration.

The related art topology creates problems in regard to the parasitic capacitance (i.e., the wire capacitance) on the signal wires. The wire capacitance decreases the potential operating frequency and increases the power consumed due to the capacitive load. Since the operating frequency of semiconductor devices is constantly increasing, reducing the wire capacitance of the signal wires allows for increased frequency and reduced power consumption, particularly on high frequency signal wires that are limited in the related art architecture.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

In the following detailed description of preferred embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and intellectual changes may be made without departing from the scope of the present invention. Moreover, it is to be understood that various embodiments of the invention, although different, are not necessarily mutually exclusive. For example, a particular feature, structure, or characteristic described in one embodiment may be included within other embodiments. The following detailed description is not to be taken in a limiting sense, and the scope of the present invention is defined only by appended claims, along with the full scope of equivalence to which such claims are entitled.

Figure 3:
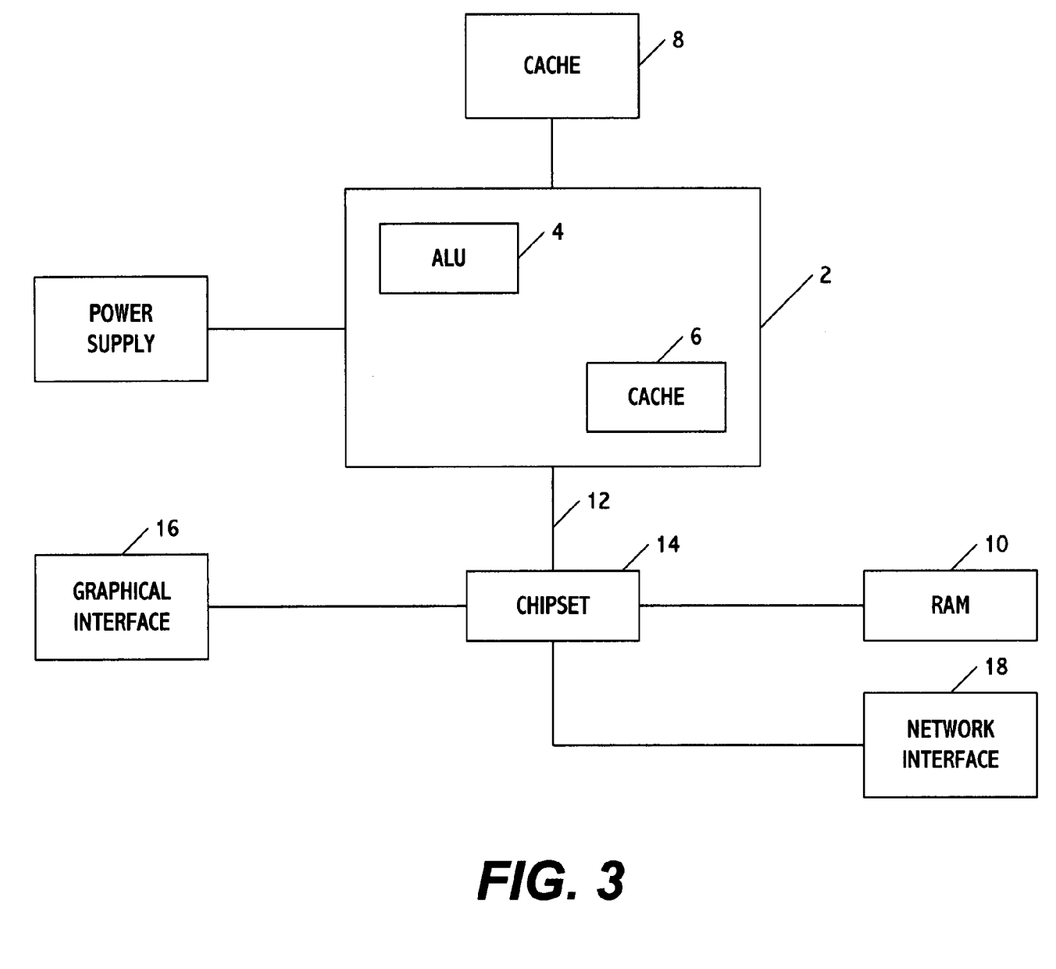
FIG. 3 illustrates a system level block diagram of a computer system according to an embodiment of the present invention.

Embodiments of the present invention relate to signal wire placement and design improvements for use in a wide variety of applications including computer systems. FIG. 3 shows an exemplary illustration of a computer system. The computer system can include a microprocessor 2, which can include an interconnect stack with additional metal layers and signals reallocated to improve the maximum frequency and/or power requirements. Microprocessor 2 can include many sub-blocks such as an arithmetic logic unit (ALU) 4 and an on-die cache 6. The microprocessor 2 may also communicate to other levels of cache, such as off-die cache 8. Higher memory hierarchy levels such as system memory 10 are accessed via host bus 12 and a chip set 14. In addition, other off-die functional units such as a graphics accelerator 16 and a network interface controller 18, to name just a few, may communicate with the microprocessor 2 via appropriate busses or ports. Examples of an interconnect stack with additional metal layers and signals reallocated are presented in the following description.

Figure 4:
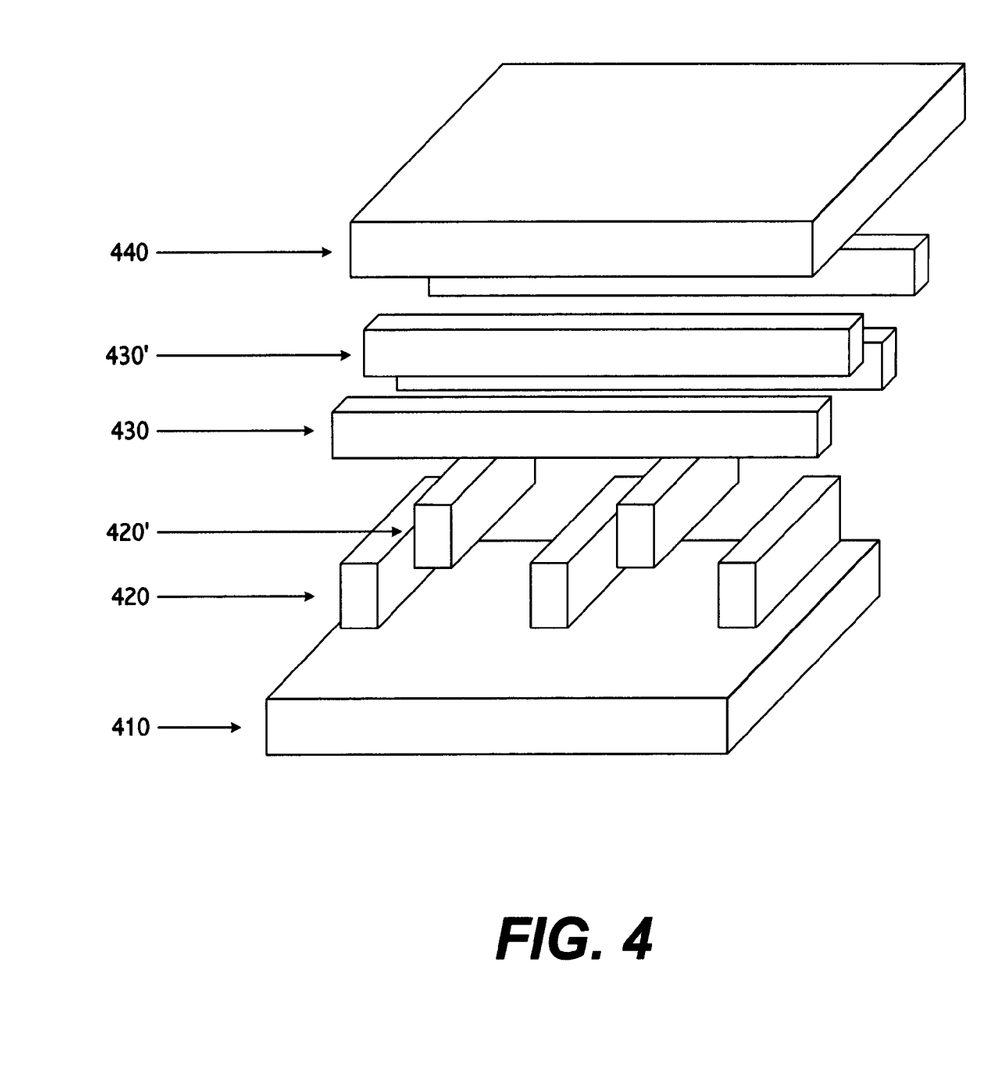
FIG. 4 illustrates a perspective view of an interconnect stack containing a plurality of signal wires and layers according to an embodiment of the present invention.

FIG. 4 illustrates a perspective view of an arrangement of an interconnect stack according to an embodiment of the present invention. The illustration can be understood in relation to the illustration of the related art arrangement of FIG. 1. As shown in FIG. 4, the interconnect stack includes layers 410, 420, 430, and 440, and two additional layers 420' and 430' that have been added to metal layers 420 and 430. The additional layers 420' and 430' preferably are orientated in the same direction as layers 420 and 430, respectively. Additionally, the signal wires of the related art layer 120 in FIG. 1 are distributed over layers 420 and 420'. Likewise, the signal wires of the related art layer 130 in FIG. 1 are distributed over layers 430 and 430'. As is apparent from FIG. 4, the signal wire separation is increased and consequently the wire capacitance for each signal wire is reduced since the signal wires are distributed over two layers. The reduced wire capacitance results in a digital gate driving that wire to have a lower load. In addition the RC delay of the wire decreases because of the lowered capacitance in the signal wire.

Figure 5A:
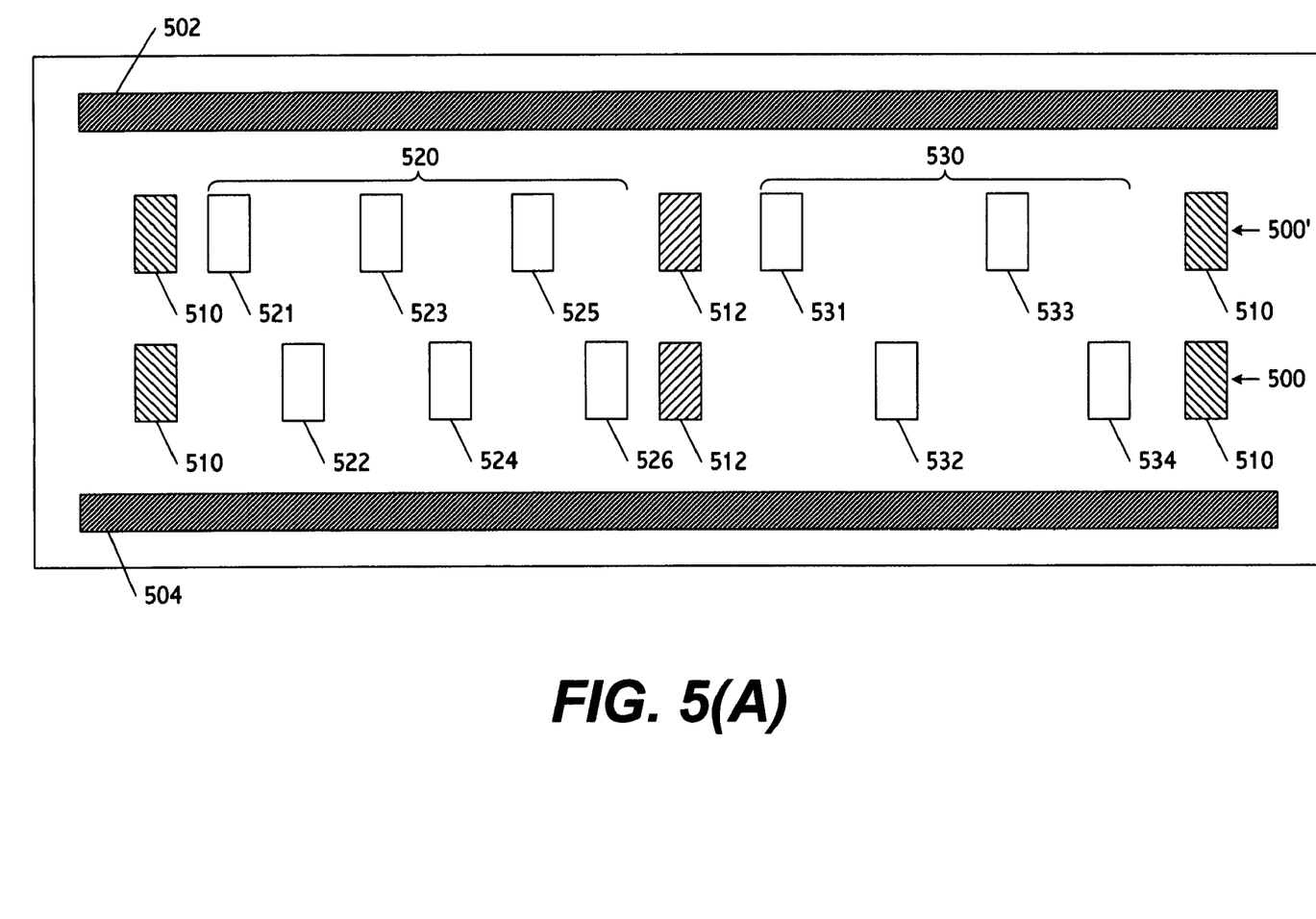
FIGS. 5A, 5B, 5C and 5D illustrate axial views of metal layers containing a plurality of signal wires according to embodiments of the present invention.

FIG. 5A illustrates an axial view of an arrangement of an interconnect stack according to an embodiment of the present invention. This illustration can be understood in relation to the illustration of the related art arrangement of FIG. 2. Ground planes 502 and 504, in this example, are above and below metal layer 500 and additional metal layer 500', respectively. Layers 500 and 500' include a plurality of signal wires including power supply wires 510 at right and left ends, ground/return wire 512 and signal wire sets 520 and 530. Each signal wire set 520, 530 includes a plurality of signal wires 521–526 and 531–534, respectively. The power supply wires 510 and ground/return wire 512 are located in both layers 500 and 500'. Although the illustrated embodiment has the power supply and ground wires in both layers, they do not have to be in both layers. However, those skilled in the art will appreciate that if a power or ground wire is present to satisfy a stringent shielding requirement (e.g., for noise reduction, delay matching, and the like), the power and/or ground lines next to the shielding-critical signal must be replicated. Information regarding the shielding requirements for a given signal can be accessed, for example, from a design database for the device as is known in the art.

The first set 520 of six signal wires 521–526 is distributed among layers 500 and 500'. Particularly, the signal wires 521–526 are alternated between the layers with signal wires 521, 523, and 525 located in layer 500' and signal wires 522, 524, and 526 located in layer 500. When compared to the arrangement illustrated in FIG. 2, it is apparent that alternating the signal wires between the base 500 and prime 500' layers increases the separation of the signal wires 521–526.

Likewise, the second set of signal wires 530 is distributed among layers 500 and 500'. Specifically, the signal wires 531–534 are alternated between the layers with signal wires 531 and 533 located in layer 500' and signal wires 532 and 534 located in layer 500. Those skilled in the art will appreciate that this arrangement is shown solely for purposes of illustration and not for limitation of the invention. The added metal layer (i.e., the prime layer 500') preferably has similar process parameters to the original metal layer (e.g., 500) in the device. However, in contrast to conventional orthogonal arrangements, the orientation of the signal wires of the prime layer is substantially parallel to the original layer. In addition, the number of signal wires on either layer can be reduced after a prime layer is added and the signals are reallocated.

Accordingly, an embodiment of the present inventions includes a semiconductor device that has a first layer and a second layer. The first and second layers are adjacent and each have a plurality of signal wires, as illustrated in FIG. 5A, for example. The signal wires in the first and second layers are substantially parallel with each other. As illustrated in FIG. 5A, adjacent signal wires are located in a substantially alternating pattern in the first and second layers. For example, every other signal wire (521, 523, 525, 531, 533) is located in the second layer and remaining signal wires (522, 524, 526, 532, 534) are located in the first layer. Therefore, the substantially alternating pattern has every other signal wire residing in the same layer in this illustration. However, not all signal wires have to follow this alternating pattern. For example, signal wires can be dedicated to specific layers or to both layers for various design purposes such as interconnections, shielding and the like. Even if all signal wires are not located in an alternating pattern, the reduced wire capacitance due to the additional metal layer and relocation of some of the signal wires still can improve the performance of the device.

Further, the power supply 510 and ground 512 wires can be located in both the first layer and second layer and in the same respective position in each layer, as illustrated. Therefore, the alternating pattern stops at the power and ground wires. For example, referring to FIG. 5A, the alternating pattern stops at either the power supply wires 510 or the ground/return wires 512, because the power and ground wires are located in both layers.

Figure 5B:
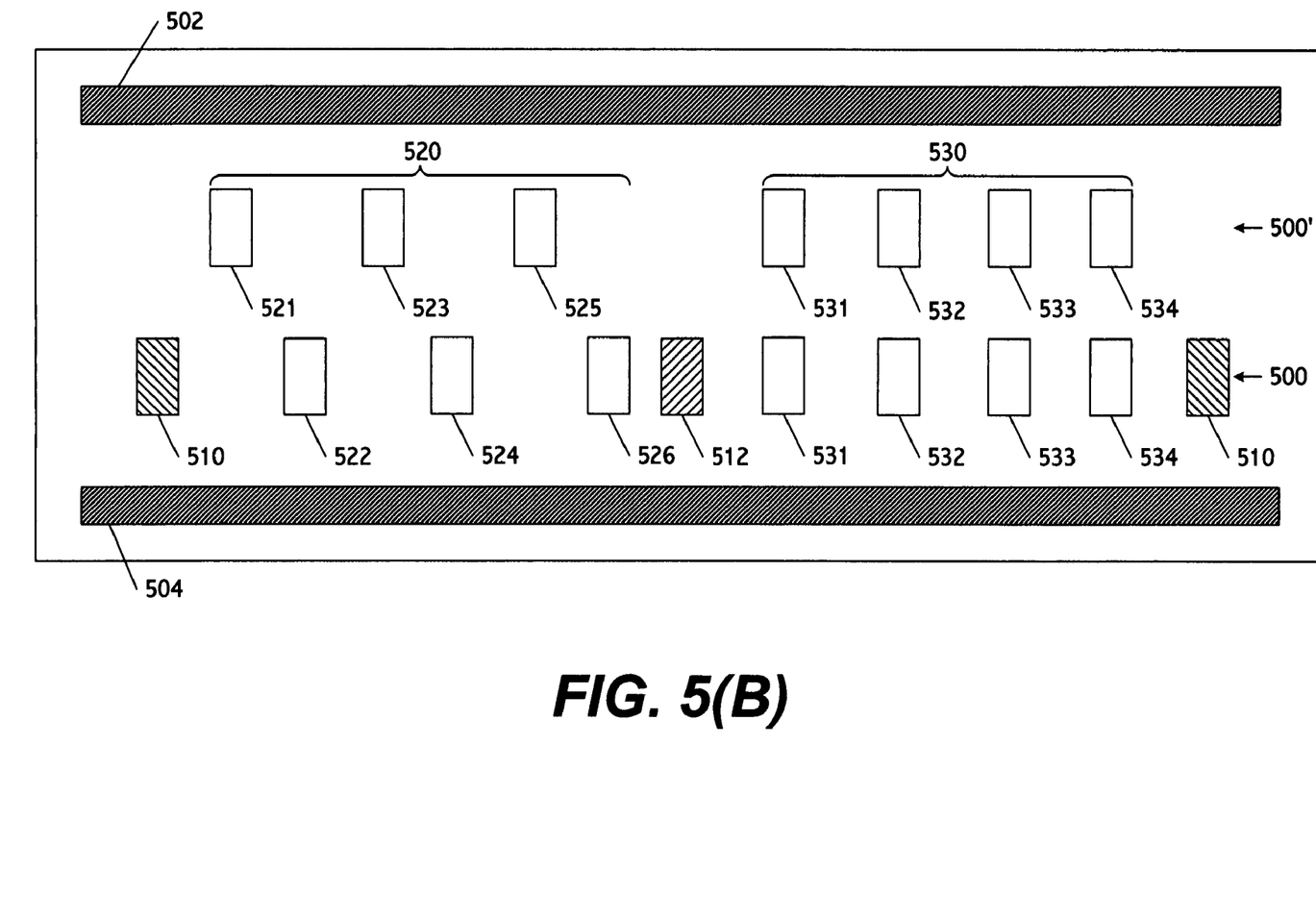

The foregoing description illustrates the specific embodiment of FIG. 5A. Another arrangement of the signal wires according to an embodiment of the present invention is illustrated in FIG. 5B. For convenience, the signal wires, layers, power supply and ground wires are labeled the same as in FIG. 5A. Referring to FIG. 5B, an axial view of an arrangement of an interconnect stack according to another embodiment of the present invention is presented. Once again, this illustration may be best understood in relation to the illustration of the related art arrangement of FIG. 2. Ground planes 502 and 504, in this example, are above and below metal layer 500 and additional metal layer 500', respectively. Layers 500 and 500' include a plurality of signal wires including power supplies 510 at right and left ends, ground/return 512 and signal wire sets 520 and 530. Each signal wire set 520, 530 includes a plurality of signal wires 521–526 and 531–534, respectively. In this embodiment, the power supply wires 510 and ground/return wire 512 are located only in layer 500. Additionally, signal wire set 530 has the signal wires 531–534 replicated in each layer, as opposed to the alternating pattern of set 520. Those skilled in the art will appreciate that certain signals in a design (e.g., word lines) can be connected to devices that have high capacitance. In this case, reducing the wire capacitances of these signals may not have the greatest impact on the RC component of the signal path. Therefore, reducing the resistance of the signal wire can be used to reduce the power losses and RC component in the signal wires thus improving the performance of these signal paths.

Figure 5C:
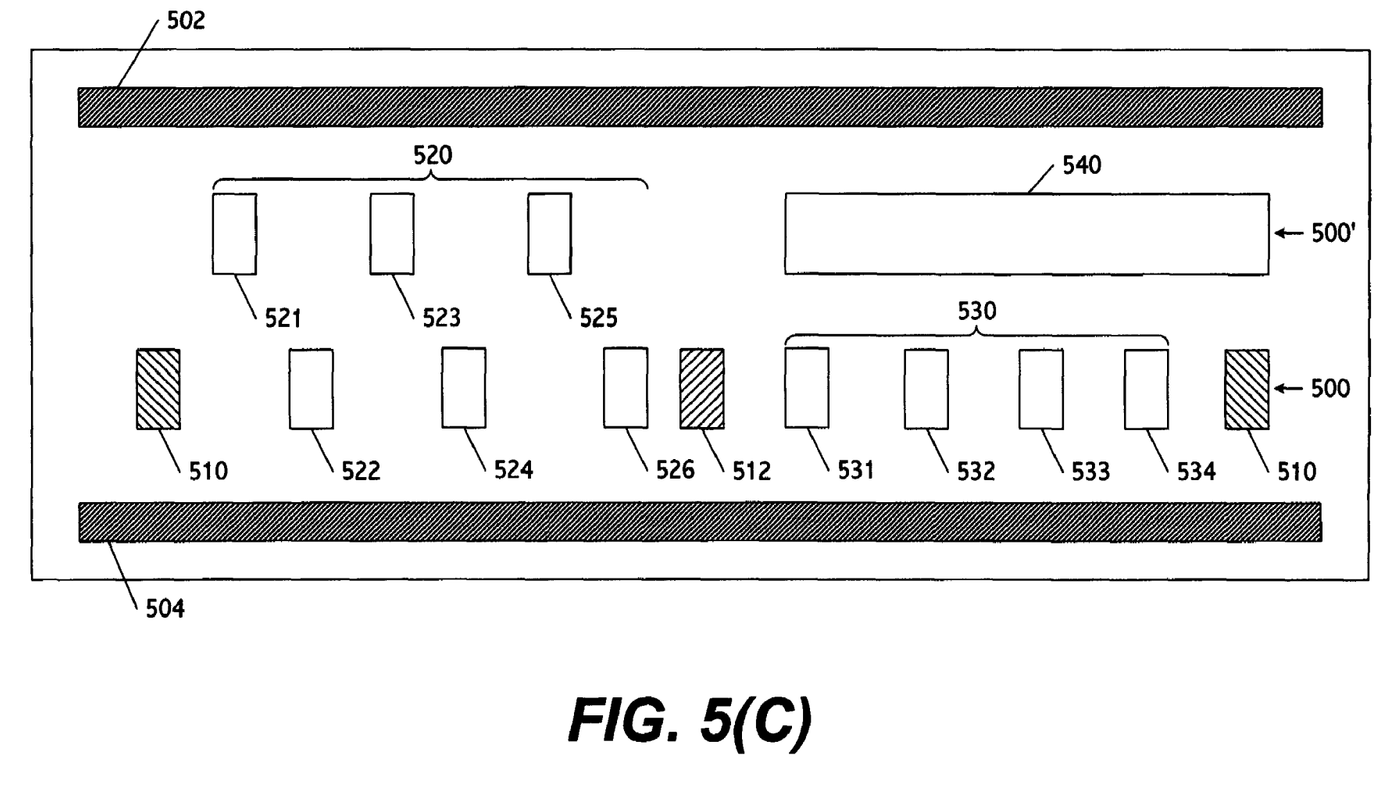

An arrangement of signal wires according to another embodiment of the present invention is illustrated in FIG. 5C. For convenience, the signal wires, layers and power and ground wires are labeled the same as in FIG. 5A. In this embodiment the signal wire set 530 is not replicated or arranged in an alternating pattern. Instead, wire set 540 is arranged in an orthogonal pattern with respect to the signal wires of the first layer. The first set 520 of six signal wires 521–526 is distributed among layers 500 and 500'. Specifically, the signal wires of set 520 are alternated between the layers with signal wires 521, 523, and 525 located in layer 500' and signal wires 522, 524, and 526 located in layer 500 as in the previous illustrations. However, in this configuration, areas of the device that do not have frequency limiting signal paths (e.g., set 530) can have signal wires arranged orthogonal to the signal wires of the first layer.

Figure 5D:
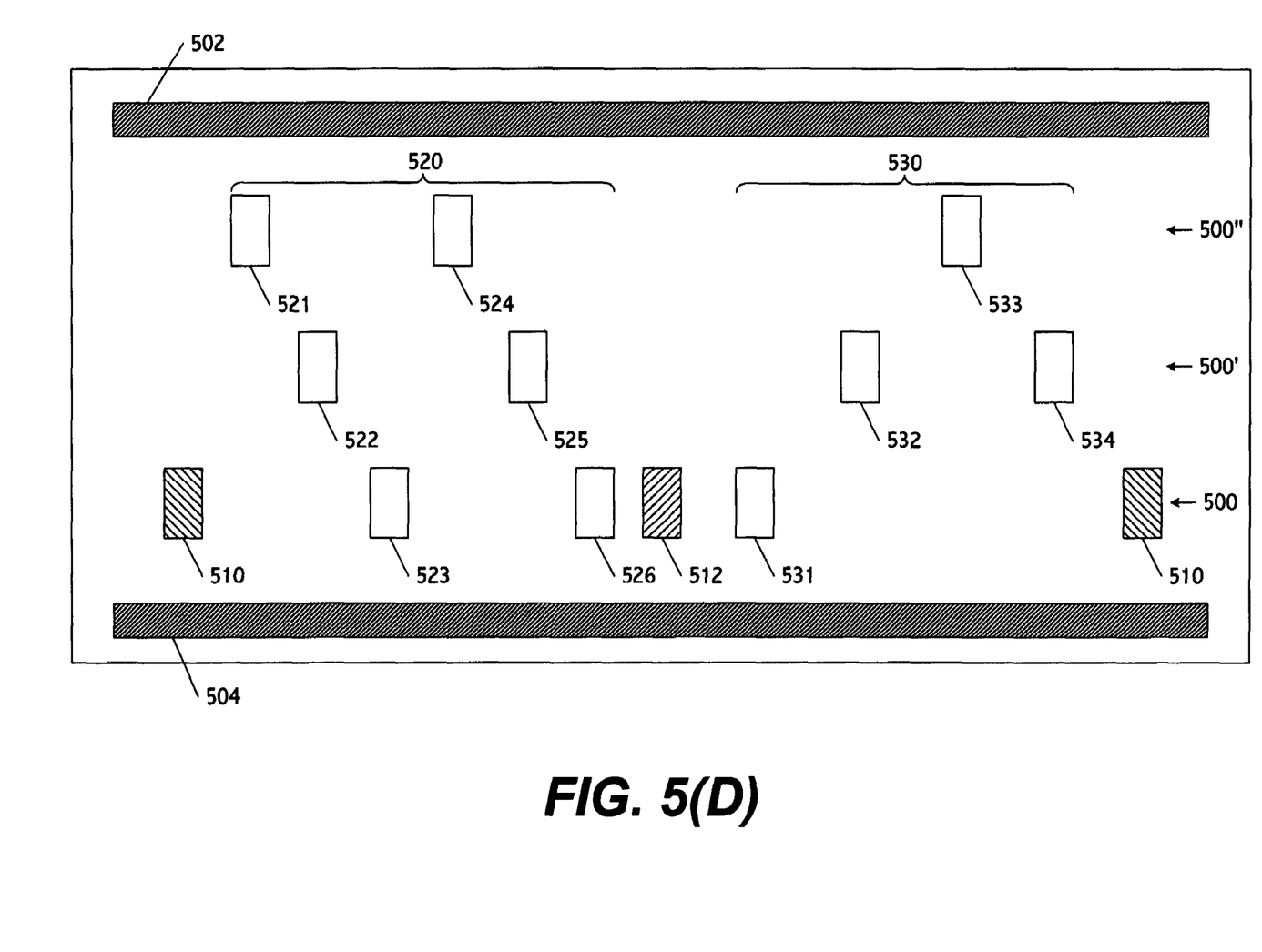

Additionally, those skilled in the art will appreciate that the design benefits are not limited to adding only one additional metal layer. For example, as illustrated in FIG. 5D, two metal layers have been added 500' and 500", when compared to FIG. 2. The signal wires 521–526 and 531–534 have been distributed over the layers to reduce the wire capacitance as in the previous examples. FIG. 5D also illustrates that the distribution of the signal wires does not have to result in the same pattern, as illustrated in signal wire sets 520 and 530. Accordingly, multiple additional layers can be added. Each additional layer also has signal wires substantially parallel to signal wires in the first and second layers. Once again, adjacent signal wires can be located in an alternating pattern or replicated in the first, second and additional layers.

In addition, more than one layer of signal wires in a device can benefit from adding an additional layer. Accordingly, an embodiment of the present invention includes a semiconductor further comprising a third and fourth layer having a plurality of signal wires. For example, layers 420 and 420' are the first and second layers and layers 430 and 430' are the third and fourth layers, as illustrated in FIG. 4. The signal wires in the third and fourth layers are substantially parallel with each other and adjacent signal wires are distributed in the third and fourth layers, for example, using the alternating pattern illustrated. However, those skilled in the art will appreciate that any of the foregoing embodiments or combinations thereof can also be used to distribute the signal wires in the third and fourth layers. Providing the additional metal layer allows for the signal wires to be distributed between the third and fourth layers, thus reducing the wire capacitance and/or resistance of the signal wires.

In general, there are two issues that drive the decision on how many additional layers are inserted. First, the preponderance of speed-limiting paths on a layer or layers. Second, the preponderance of power contributing paths on a layer or layers. These two issues are discussed in more detail in the following sections.

Regarding the first issue, an N-metal layer system can have speed limiting paths evenly distributed on all layers. In this case, the maximum benefit is obtained from adding N extra (i.e., prime) layers to the design, one for each pre-existing layer. However, in a typical microprocessor design, for example, the lower N/2 metal layers (or more) are utilized for local interconnection (e.g., within a functional block such as an adder, incrementer, and the like). The upper N/2 metal layers can carry global routes such as system clocks, long-distance signals, power grid, and the like. Accordingly, the upper N/2 layers are more likely to contain the frequency limiting speed paths. Depending on the speed path distribution with respect to the metal layers, the prime layer can be inserted only on the original layers that had enough speed paths to justify the additional cost of adding the prime layer. Those skilled in the art will appreciate that the justification of adding the prime layers is empirical and based on the additional processing cost, market demand, frequency improvement, power reduction, and the like.

Regarding the second issue, the power contributing paths are not necessarily the same as the frequency limiting speed paths, since the power aspect is dependent on total capacitance and activity level on the path. However, once the power contributing paths are identified reducing the wire capacitance of the signal wires or the effective resistance by replicating signal wires can reduce the power consumption, as discussed in the foregoing sections.

Given the above considerations, the layers in a design that have the most impact on the speed limiting paths and high power consumption should be identified. The speed-limiting paths (e.g., due to capacitive loading and/or RC delay) can be identified by a timing analysis of the whole chip with the interconnect capacitances and resistances of signal paths on various layers modeled accurately, as is known in the art. The power consumption can be determined by monitoring nodal activity while running a high power test pattern (e.g., in a microprocessor design), as is known in the art. Layers that have a significant contribution to the overall power can then be identified. Based on the identified speed limiting and high power consuming layers, additional layers can be inserted adjacent to these layers to reduce the impact on the semiconductor device's performance in terms of increased operating frequency and/or reduced power consumption.

Figure 6A:
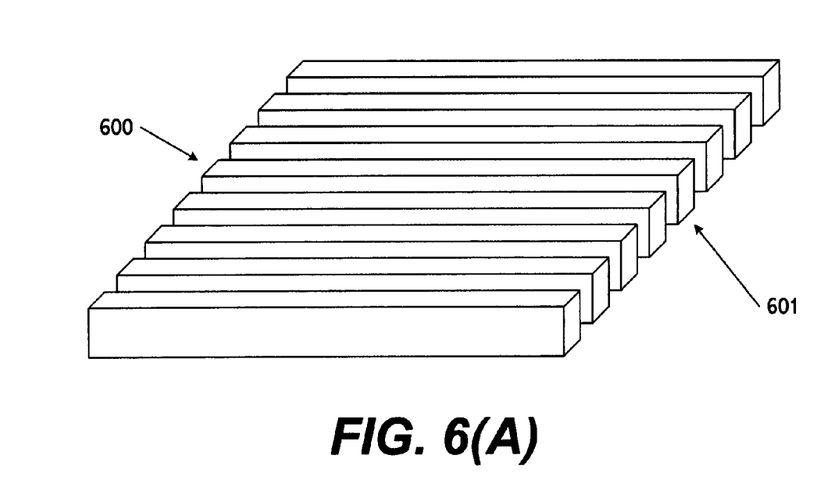
FIG. 6A illustrates an example of identifying a signal wire as a critical signal wire.

FIG. 6A illustrates a plurality of signal wires on a layer that embodiments of the present invention can be applied to. For example, signal wires 600 can be analyzed and the critical signal wire 601 on the layer is used as a seed for a method according to an embodiment of the present invention. The method will be described in the following sections.

Figure 6B:
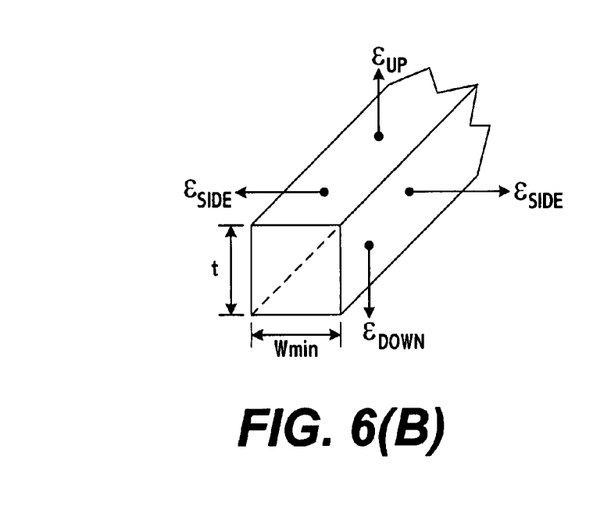
FIGS. 6B and 6C illustrates process parameters with regard to signal wires.
Figure 6C:
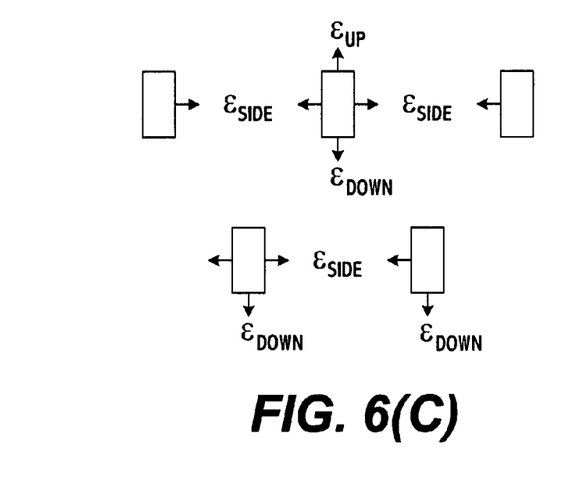

Additionally, the layers (i.e., the prime layers) that are added preferably have the same process parameters. FIG. 6B illustrates, a signal wire and related process parameters in the original layer. Wires in a process technology (e.g., 0.13 μm) have a thickness "t", which can be different for different layers and a minimum width $W_{min}$, which is the minimum width at which a wire can be drawn. Once again, different layers can have different minimum widths. However, an inserted layer (i.e., prime layer) preferably supports the same thickness and minimum width as the original layer. Further, wires in a layer can have different permittivity for sidewall capacitance ($\epsilon_{side}$) versus up capacitance ($\epsilon_{up}$) versus down capacitance ($\epsilon_{down}$). Accordingly, the inserted layer (i.e., prime layer) preferably has similar dielectric permittivities to its neighbors as the original. This can be difficult to accomplish if $\epsilon_{up}$ is not equal to $\epsilon_{down}$. However, in this case $\epsilon_{up}$ can be made the same on the upper (e.g., prime layer 500') and $\epsilon_{down}$ can be made the same on the lower layer (e.g., original layer 500). An example of this arrangement is illustrated in FIG. 6C. Although the process parameters are not the same with respect to the permittivity at the border of the layers, the increased spacing can still reduce the wire capacitance.

Figure 7A:
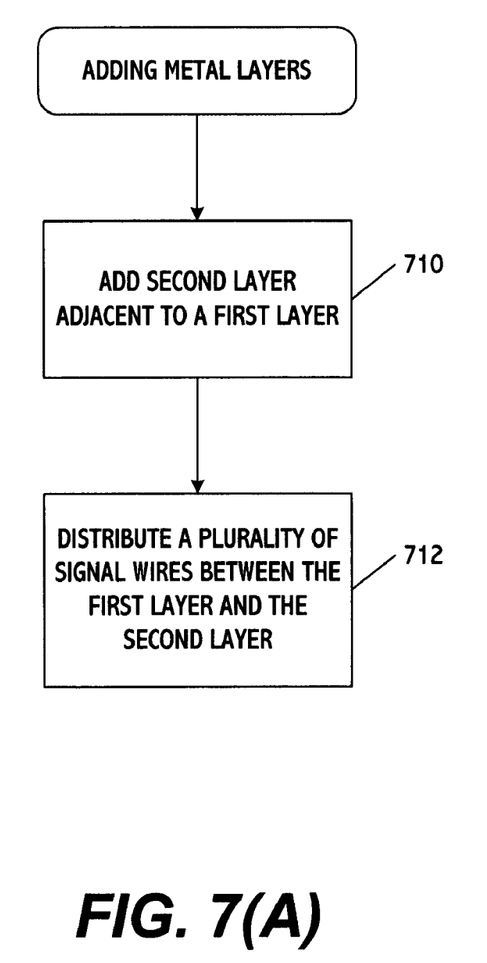
FIGS. 7A, 7B and 7C are flowcharts for adding metal layer containing a plurality of signal wires according to embodiments of the present invention.

FIG. 7A is a flow chart illustrating a method of adding metal layers in a semiconductor device with alternating signal wire reallocation according to an embodiment of the present invention. In block 710, a second metal layer is added to a first metal layer. The first and second layers are adjacent. A plurality of signal wires is distributed between the first layer and the second layer, in block 712. The plurality of signal wires is preferably substantially parallel with each other. As discussed above, adding the second layer (i.e., prime layer) allows for increased separation of the signal wires and/or replication of the signal wires to reduce the wire capacitance and/or resistance and consequently the RC delay and power consumption.

Figure 7B:
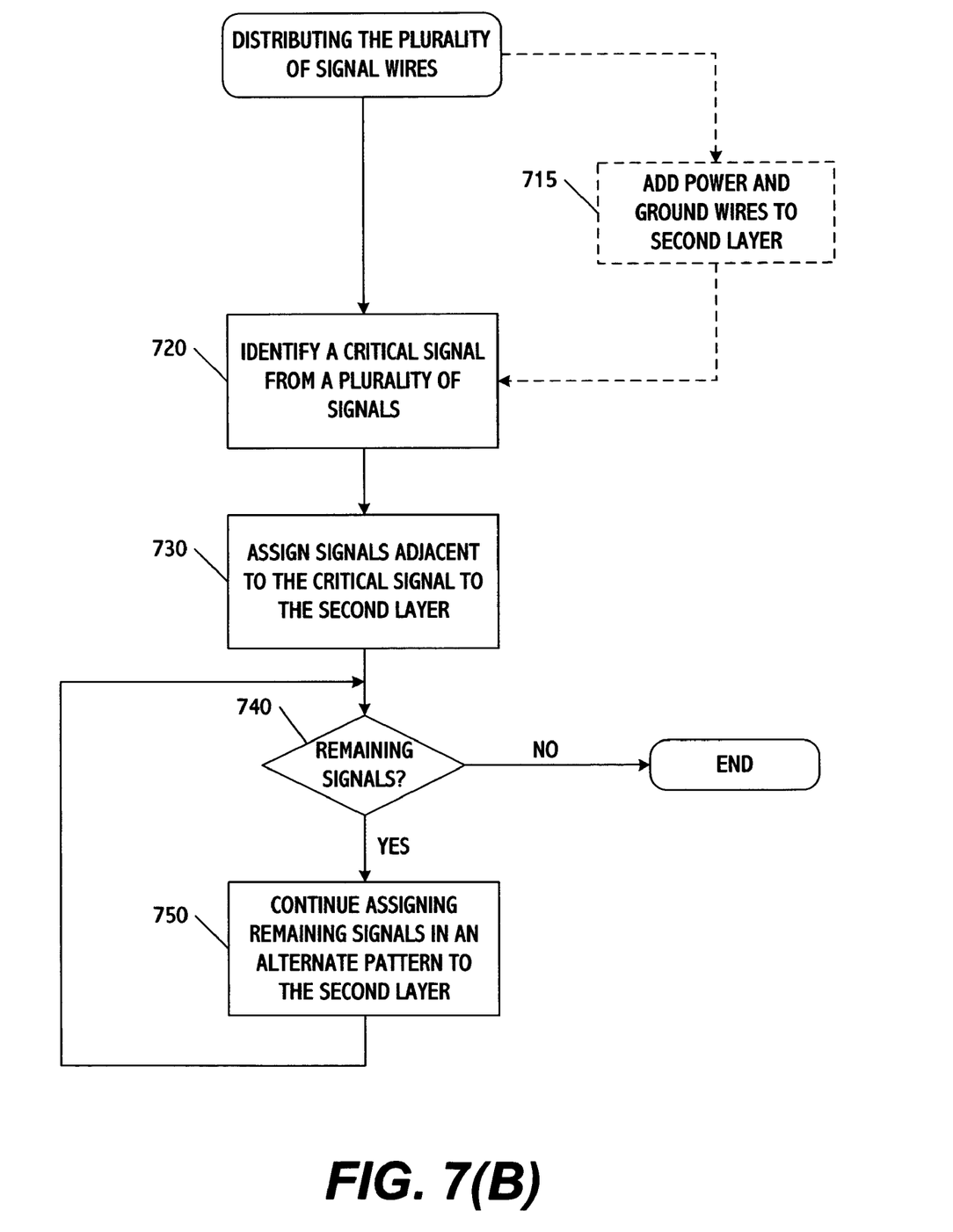

FIG. 7B illustrates additional steps regarding distributing the plurality of signal wires. The critical signal wire from a plurality of signal wires in the first layer is identified, in block 720. For example, the critical signal wire can be a signal wire that is frequency limited due to the wire capacitance in a conventional layer design, as discussed in the foregoing description. Accordingly, the frequency limiting speed paths are identified and the critical signal wire is used as a seed to start the signal wire reallocation process.

The signal reallocation process can start by assigning the signal wires adjacent to the critical signal wire to the second layer (or alternate layer), in block 730. The first layer is checked to see if there are remaining signal wires to reallocate, in decision block 740. The process continues assigning the remaining signal wires in an alternating pattern to the second layer, in block 750 until all signal wires are assigned. For example, starting at the critical signal wire, the signal wires on the left and right are assigned to the second layer. Then, the process can continue in both directions. Thus, the next signal wire encountered in both directions would stay in the first layer, and the signal wire after that would be moved to the second layer and so on until all signal wires have been processed.

FIG. 5A illustrates the result of applying the forgoing method to a signal wire arrangement as illustrated in FIG. 2. The configuration in FIG. 2 showed all signal wires in a first layer 200. In FIG. 5A, the signal wires have been distributed between the first layer 500 and the second layer 500' in an alternating pattern. Additionally, note that the power supply 210 and ground 212 wires in FIG. 2 are replicated in each layer 500 and 500' in FIG. 5A. Therefore, the foregoing method can further include inserting power 510 and ground 512 wires into the second layer, as illustrated in optional block 715. Additionally, the power and ground wires in the second layer can have the same respective position (e.g., horizontal position) as the power and ground wires in the first layer, as illustrated in FIG. 5A. Accordingly, a method according to an embodiment of the present invention can further comprise stopping the alternating pattern at power supply and ground wires and then resuming the alternating pattern at a next signal wire after the power supply or the ground. This aspect is illustrated in FIG. 7C.

Figure 7C:
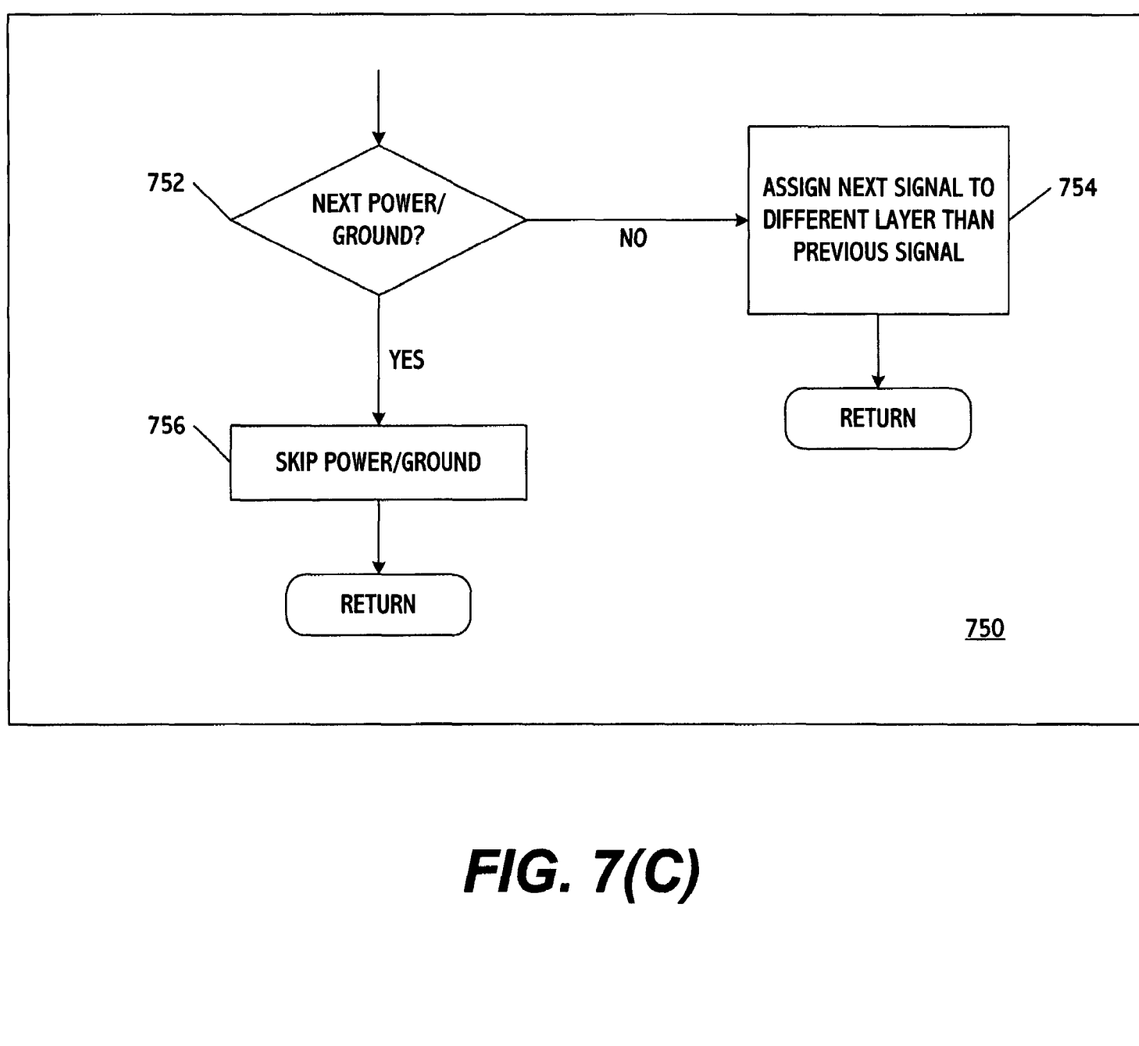

Referring to FIG. 7C, an embodiment of block 750 is illustrated. In decision block 752, the next wire is checked to see if it is a power or ground wire. If a power or ground wire is encountered, then that wire is skipped (i.e., the alternating pattern stops). However, if the next wire is a signal wire, then the pattern continues and assigns that signal wire to a different layer than the previous signal wire (i.e., the alternating pattern continues). If the previous wire were a power supply or ground, then the pattern would resume at the next signal wire following the power supply or ground wire. Regardless of whether a power supply, ground or signal wire is encountered, the process returns and loops to block 740 to check for remaining signal wires to assign.

Once again, the foregoing description in regard to FIGS. 7B and 7C illustrates specific examples of embodiments of the present invention and has been provided solely for illustration and not limitation. Alternative methods can be appreciated from the foregoing illustrations of FIGS. 5A–5D. For example, distributing the signal wires can include replicating a set of signal wires in both the first and second layers, as illustrated in FIG. 5B. Further, additional signal wires in the second layer can be arranged substantially orthogonal to the signal wires in the first layer, as illustrated in FIG. 5C.

Those skilled in the art will appreciate that embodiments of the present invention are not limited to only two layers. Accordingly, a method according to an embodiment of the present invention can further comprise providing at least one additional layer, such as illustrated in FIG. 5D. The signal wires in the at least one additional layer are substantially parallel signal wires in the first and second layers. Further, adjacent signal wires can be located in an alternating pattern in the first, second and at least one additional layer.

Additionally, embodiments of the present invention can be used to improve the performance of existing microprocessor designs. For example, in FIG. 7B block 720, identifying the critical signal wire, can further include analyzing an existing microprocessor design to identify frequency limiting signal wires, using techniques known in the art, such as those discussed in the foregoing description. Then, one of the frequency limiting signal wires is identified as the critical signal wire. In the case when there is more than one frequency limiting signal wire, the most critical (e.g., the signal wire that is most limited) is used as the critical signal wire. Once the critical signal wire in the existing (first) layer is identified, the signals are distributed over the second layer and first layer to reduce the wire capacitance and consequently improve the potential frequency and power consumption of the existing design. Alternate methods of assigning an alternating pattern to signal wires can also be used. For example, even a random selection the signal wires and/or patterns will result in some improvement because of the increased and reduced wire capacitance. Additionally, critical signal wires can be identified as the signal wires in a layer that have high power consumption, as discussed in the foregoing description.

As noted with respect to FIG. 3, embodiments of the present invention relate to signal wire placement and design improvements for use in a wide variety of applications including computer systems. Accordingly an embodiment of the present invention includes a computer system comprising a microprocessor 2 and an off-die component (e.g., 8, 10, 12, 18, 16) in communication with the microprocessor. The microprocessor comprises a first layer having a plurality of signal wires and a second layer having a plurality of signal wires. The signal wires in the first and second layers are substantially parallel with each other and adjacent signal wires are located in an alternating pattern in the first and second layers. Further, the various embodiments described in the foregoing description can be applied to the microprocessor and other components in the system to increase the potential operating frequency and reduce the power consumption of these devices. Additionally, those skilled in the art will appreciate that the term microprocessor used herein refers broadly to processing devices including microprocessors, Digital Signal Processors (DSPs), microcontrollers, and the like The foregoing descriptions of embodiments of the present invention discuss the benefit of reducing parasitic capacitance, with respect to frequency. Additionally, the reduction of the wire capacitance reduces the dynamic load. For example, a reduction of the wire capacitance in the interconnect stack of ten percent, will result in an approximately ten percent reduction in the dynamic power consumed in the interconnect stack.

Further, consider a microprocessor with fifty percent of its power loss coming from wire capacitance. By inserting as many additional metal layers as there are in an existing microprocessor design (e.g., 2 to 4, or from 4, to 8), the interconnect contribution to the power loss can be reduced by half. Still further, the drivers on the inputs can be reduced in size because of reduced wire capacitance, leading to approximately a twenty-five percent or more reduction in power.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A semiconductor device, comprising:
   a first set of signal wires, including a first plurality of signal wires distributed in a first layer and a second plurality of signal wires distributed in a second adjacent layer;
   a second set of signal wires, including a third plurality of signals wires distributed in the first layer and a fourth plurality of signal wires distributed in the second layer, the first and second sets having a different number of signal wires, with the signal wires in the first set being substantially parallel and arranged in a first pattern, and the signal wires in the second set being substantially parallel and arranged in a second pattern, wherein:

the first and second layers are on different vertical levels of said device, the signal wires in the first layer and the signal wires in the second layer extend along different longitudinal axes which do not intersect, and said device further includes one or more ground or return wires that extend parallel to the signals wires in the first and second sets, the ground or return wires disposed between the signal wires in the first set and the signal wires in the second set.

2. The semiconductor device of claim 1, wherein each of the first and second sets have an even number of signal lines.

3. The semiconductor device of claim 1, wherein the first layer has a number of signal wires from the first and second sets different from a number of signal wires from the first and second sets in the second layer.

4. The semiconductor device of claim 1, wherein the first and second patterns are a same pattern.

5. The semiconductor device of claim 1, wherein the first and second patterns are alternating patterns.

6. The semiconductor device of claim 1, wherein the number of signal wires in the first layer of the first set is different from the number of signal wires in the first layer of the second set.

7. The semiconductor device of claim 1, wherein the first and second layers are adjoining layers.

8. The semiconductor device of claim 1, wherein signal wires in the first layer are local interconnect wires and signal wires in the second layer are global routing wires.

9. The semiconductor device of claim 1, wherein the signal wires in the first set have a same permittivity and the signal wires in the second set have a same permittivity.

10. The semiconductor device of claim 1, wherein the first set of signal wires is separated from the second set of signal wires by ground or return wires in the first and second layers.

11. The semiconductor device of claim 10, wherein the first set of signal wires is located between the one or more ground or return wires and one or more power supply wires.

12. The semiconductor device 11, wherein the second set of signal wires is located between the one or more ground or return wires and one or more additional power supply lines.

13. The semiconductor device of claim 12, wherein the signal wires from the first and second sets located in the first layer are between first and second power supply lines in the first layer.

14. The semiconductor device of claim 13, wherein the signal wires from the first and second sets that are located in the second layer are between third and fourth power supply lines in the second layer.

15. The semiconductor device of claim 1, wherein the first layer is formed over the second layer.

16. The semiconductor device of claim 1, wherein the signal lines in the first and second sets are oriented in a same direction.

17. The semiconductor device of claim 1, wherein the signal lines in the first and second sets are parallel to one another.

* * * * *